United States Patent [19]

Raffel et al.

[11] Patent Number: 4,636,404

[45] Date of Patent: Jan. 13, 1987

[54] METHOD AND APPARATUS FOR FORMING LOW RESISTANCE LATERAL LINKS IN A SEMICONDUCTOR DEVICE

[75] Inventors: Jack I. Raffel; John A. Yasaitis, both of Lexington; Glenn H. Chapman, Bedford, all of Mass.

[73] Assignee: Mass. Institute of Technology, Cambridge, Mass.

[21] Appl. No.: 651,230

[22] Filed: Sep. 17, 1984

Related U.S. Application Data

[62] Division of Ser. No. 389,385, Jun. 17, 1982, abandoned.

[51] Int. Cl.⁴ ............... B05D 3/06; B05D 5/12; B23K 9/00
[52] U.S. Cl. ............... 427/53.1; 219/121 LC; 219/121 LM; 427/86; 427/88
[58] Field of Search ............. 219/121 LC, 121 LM; 427/53.1, 86, 88

[56] References Cited

U.S. PATENT DOCUMENTS

| | | | |
|---|---|---|---|
| 4,023,005 | 5/1977 | Bolin | 219/121 LM |
| 4,151,545 | 4/1979 | Schnepf et al. | 357/71 |
| 4,168,444 | 9/1979 | van Santen | 357/59 |
| 4,270,137 | 5/1981 | Coe | 357/59 |
| 4,270,960 | 6/1981 | Bollen et al. | 357/71 |
| 4,289,834 | 9/1981 | Alcorn et al. | 357/71 |
| 4,413,272 | 11/1983 | Mochizuki et al. | 357/71 |
| 4,438,450 | 3/1984 | Sheng et al. | 357/71 |
| 4,446,613 | 5/1984 | Beinglass et al. | 357/59 |

OTHER PUBLICATIONS

J. G. Posa, "Redundancy-What to do When the Bits Go Out", 7/28/81, pp. 117-120, Electronics.
G. H. Chapman et al., "A Laser Linking Process for Restructurable VLSI*", MIT, Cleo '82, 4/14-16/82, Phoenix, Arizona.
J. F. Smith et al., "Laser Induced Personalization & Alterations of LSI & VLSI Circuits", IBM Corporation.
O. Minato et al., "A High-Speed Hi-CMOSII 4K Static RAM", pp. 449-453, IEEE Journal of Solid-State Circuits, vol. SC-16, No. 5, Oct. 1981.
J. M. Harris et al., "Solid-Phase Crystallization of Si Films in Contact with Al Layers*, pp. 2897-2904, Journal of Applied Physics, vol. 48, No. 7, Jul. 1977.
M. Hongo et al., "THD2 Connecting Conductors on Semiconductor Devices by Lasers" Hitachi, Ltd., 4/15/82.
J. I. Raffel et al., "Laser Programmed Vias for Restructurable VLSI*", pp. 132-135, Int'l Electron Devices Meeting, 12/1980.

Primary Examiner—Michael R. Lusignan
Attorney, Agent, or Firm—Kenway & Jenney

[57] ABSTRACT

A method and apparatus for reliably forming low resistance links between two aluminum conductors deposited on an insulating polysilicon or amorphous silicon layer, employ a laser to bridge a lateral gap between the conductors. The apparatus and method are ideally suited for implementing defect avoidance using redundancy in large random access memories and in complex VLSI circuits. Only a single level of metal is employed and leads to both higher density and lower capacitance in comparison to prior techniques. Resistances in the range of one to ten ohms can be achieved for gap widths of approximately two to three microns.

9 Claims, 4 Drawing Figures

MEANS± STANDARD DEVIATION OF LINK RESISTANCE IN OHMS
FOR VARIOUS LEVELS OF LASER POWER

| LASER POWER | GAP WIDTH | | | | |
|---|---|---|---|---|---|
| | 1.7 μm | 2.0 μm | 2.4 μm | 2.8 μm | 3.4 μm |
| 0.8 W | 4.4* | 0.7* | 2.7* | 11.7* | >10³* |
| 1.0 W | 0.7±29% | 0.6±15% | 1.2±65% | 7.3* | >10³* |
| 1.2 W | 0.7±33% | 0.7±27% | 0.8±20% | 1.1* | >10³* |
| 1.4 W | 0.8±52% | 0.7±27% | 0.8±24% | 3.3* | >10³* |
| 1.6 W | 0.8±25% | 0.9±37% | 1.1±31% | 1.1* | 7.8* |
| 1.8 W | 0.9±31% | 0.7±47% | 0.9±26% | 2.4* | 43* |
| 2.0 W | 0.8±25% | 0.7±27% | 0.8±26% | 1.7* | 18* |

*DISTRIBUTION SKEWED, STANDARD DEVIATION NOT APPLICABLE.

METHOD AND APPARATUS FOR FORMING LOW RESISTANCE LATERAL LINKS IN A SEMICONDUCTOR DEVICE

The Government has rights in this invention pursuant to Contract F-19628-80-C-0002 awarded by the Department of the Air Force.

This is a division of application Ser. No. 389,385, filed June 17, 1982, now abandoned.

The invention relates generally to semiconductor integrated circuit structures and in particular, to an apparatus and method for restructuring integrated circuits utilizing low resistance additive links.

As the size and complexity of large scale integrated circuits increases, it becomes inevitably more difficult to obtain high yields of "good" wafers until the product has significantly matured. Thus, in its initial stages, the profitability of a complex product is relatively small.

As a consequence, creative integrated circuit manufacturers have begun to employ redundancy techniques to improve the yield of complex integrated circuit structures from the very beginning. According to this technique, in addition to the required circuit elements needed by a circuit function, additional redundant circuit elements have been built onto the chip. For example, spare rows or columns of cells, for a random access memory of the 64K variety, have been employed. If, during manufacture of a memory chip, there is a bad unit on the chip, the bad unit can be removed from the circuit configuration and a "good spare" can be added. In this manner, good cells can be substituted for bad ones and the yield of a semiconductor line, even from its early stages, can be significantly improved.

In view of the importance of the redundancy technique in adding or subtracting circuit elements on a semiconductor chip, much research and development effort has been expended in this area. Typically, the majority of techniques used in restructuring integrated circuits utilized a deletive process. According to this process, the bad cells are removed from active participation in the circuit structure using for example electrical fuses, laser cuts, or non-volatile storage elements such as floating gates.

Two other techniques have also been described in the literature for producing the low resistance additive links (low resistance being less than about 10 ohms) which are necessary for restructuring complex general purpose logic. Both techniques require two levels of metal. Furthermore, one of the techniques requires the use of an unconventional insulator material while the other one can produce splatter and debris during the linking process. A third technique, which permits lateral linking between polysilicon conductors using local heating to dope previously undoped polysilicon, results in relatively high link resistances on the order of 500 ohms.

A primary object of this invention is a lateral link apparatus and method which use conventional materials to provide low resistance additive links useful in restructuring complex general purpose integrated circuit logic. Another object of the invention is an easily controlled, high reliability apparatus and method for providing low resistance lateral links. A yet further object of the invention is providing conventional MOS design circuits with the capability of forming reliable low resistance lateral links therein.

SUMMARY OF THE INVENTION

The invention relates to a method for forming a conductive link on a semiconductor device. The method features the steps of forming at least a first and a second single layer conductor on an insulating layer surface, the first and second conductors being insulated from each other and having a planar lateral gap therebetween, The method then features locally heating the surface area of the device, including the gap, for forming a conductive bridge across the gap which connects the first and second conductors.

Preferably, the heating step is implemented by directing a laser source of energy at the gap area for forming the conductive bridge. Typically, the conductor material overlays an insulating polysilicon crystalline layer. Between the two layers is a diffusion prevention layer and beneath the polysilicon layer is an insulating layer to electrically insulate the structure from the device substrate surface. In another embodiment, an amorphous silicon layer can be employed, either above or below the conductors.

The apparatus of the invention relates to an integrated circuit device having a semiconductor substrate and, in a preferred embodiment, features a structure which employs an electrically insulating layer over the substrate, a polysilicon or amorphous silicon layer overlying the insulating layer, a diffusion inhibiting layer such as CVD silicon dioxide overlying the polysilicon layer and at least one conductor pair having first and second conductors with their first and second ends respectively separated by a gap. The conductor pair overlies the inhibiting layer and the first and second conductors have a planar relationship to each other.

Preferably, the conductors are an AlSiCu composition having about 1.5% silicon and 2% copper.

BRIEF DESCRIPTION OF THE DRAWINGS

Other objects, features, and advantages of the invention will appear from the following description taken together with the drawings in which.

DESCRIPTION OF PREFERRED EMBODIMENT

Figures 1, 2, 3, 4:
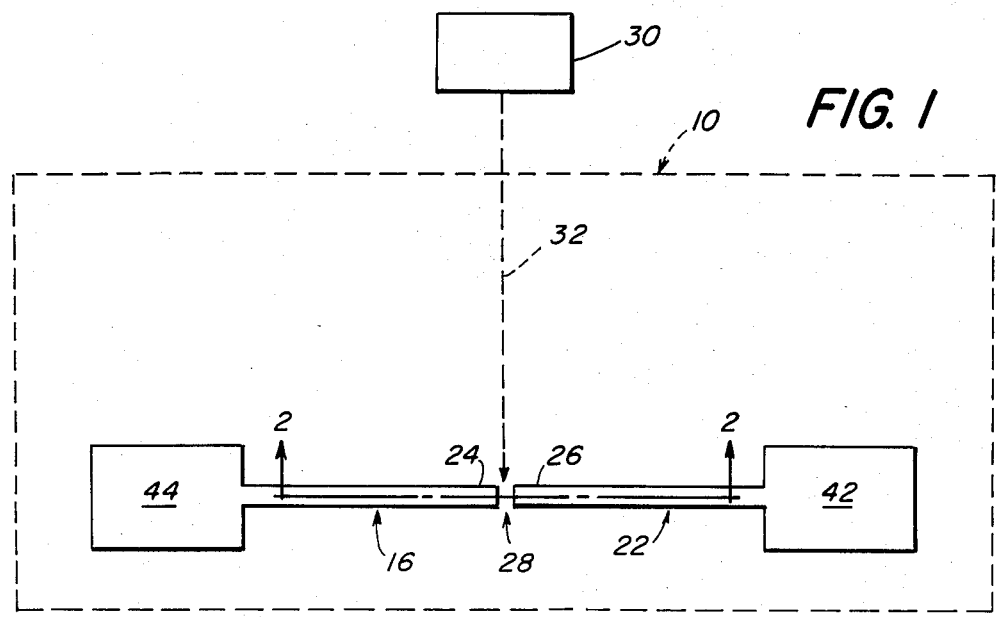
FIG. 1 is a schematic planar view of a typical semiconductor wafer wherein the invention can be employed.
FIG. 2 is a cross-sectional view along lines 2—2 of FIG. 1.
FIG. 3 is a table showing typical resistances as a function of gap width and laser power.
FIG. 4 is a cross-sectional view of an alternate low resistance lateral link structure according to the invention using an amorphous layer atop the conductors.

Referring to FIGS. 1 and 2, an integrated circuit device 10, a semiconductor device, has a conductor 16 and a conductor 22, with respective ends 24 and 26 which are spaced from each other by a gap 28. The gap 28, separating ends 24 and 26, provides, in combination with the underlying structure, electrical isolation between conductors 16 and 22. However, if required, according to the invention, a conductive link can be provided across what is shown as gap 28 to connect ends 24 and 26 in an electrically conductive, low resistance, lateral link.

According to the preferred embodiment of the invention, the electrically conductive lateral link is accomplished using a laser linking system 30. According to the illustrated embodiment, a CW argon laser can be employed. The argon laser can be mechanically shuttered to produce relatively long duration pulses, for example 1 millisecond pulses. The result, in one particular embodiment, when the laser is directed at the area of gap 28, such as along path 32, is a smooth, well rounded crater wall and rim about 4 microns in overall diameter. A circular disturbed region, approximately 12 microns in diameter surrounds the crater. This can be seen by silicon plasma etching. The silicon surface in this "disturbed region" is textured but does not appear to contain any splattered material. Probably, this is because of the use of long, low power laser pulses.

According to a preferred structure of the device, the conductors 16 and 22 are strips, 0.7 microns thick, of an aluminum AlSiCu composition (1.5% silicon and 2% copper) overlying a diffusion prevention layer 34 of CVD silicon dioxide 12 nanometers thick. The CVD silicon dioxide layer overlies a layer 36 of LPCVD polycrystalline silicon (polysilicon). The polysilicon layer rests on an insulating layer 38 of thermal oxide which is grown on and protects a silicon substrate 40. Thus, the aluminum conductors are on a single planar level and the resulting low resistance lateral links using the process are reliable and substantially splatter free. This structure should be readily compatible with conventional MOS designs.

EXAMPLE 1

A typical structure can be fabricated as follows. A 1 micron thermal oxide layer is grown on an N(100) silicon substrate. A 0.5 micron undoped LPCVD polysilicon layer is then deposited at 610° C. The 12 nanometer CVD layer of silicon dioxide is deposited on the polysilicon layer; and the conductors composed of the aluminum-silicon-copper alloy are sputter deposited to form conductors having a thickness of 0.7 microns. (The AlSiCu alloy is preferred because it exhibits reduced electromigration during use. Other electrically conductive materials could also be employed.) The metal lines are preferably plasma etched to a width of, for example, 8.5 microns. This aids in a disconnect function if desired.

Lateral linking is accomplished, as noted above, in the illustrated embodiment, by using the continuous wave (CW) argon laser linking system 30 which is mechanically shuttered to produce a one millisecond duration pulse. (Pulses up to at least about five milliseconds can also be employed as required.) For example, the argon laser linking system can be that described in a paper offered by Raffel, Naiman, Burke, Chapman, and Gottschalk, "Laser Programmed Vias for Restructurable VLSI," 1980 IEDM Technical Digest, page 132, which disclosure is incorporated herein by reference. The laser beam has a Gaussian distribution with a diameter, in the illustrated embodiment, as measured at its 1/e power points, of 3 microns. The positioning accuracy of the beam was 0.65 microns. This provides a power density, at the conductor surface of about $7.5 \times 10^{10}$ wt/cm$^2$. (Typically, there is about a 25% power loss between the laser output and the semiconductor surface.)

It is not clear whether the electrical bridge connection between conductor ends 24 and 26 (the lateral link) is formed by an aluminum bridge along the wall of the crater formed after the laser pulse, or by aluminum doped silicon, since aluminum is a p-type dopant in silicon. However, it is clear that the resulting structure has a very low resistance. The lateral link resistance can be measured using, for example measuring pads 42, 44 (FIG. 1). Because aluminum and silicon are mutually soluble in the liquid state, but nearly insoluble in the solid state, a silicon bridge would most likely consist of a fine grain mixture of aluminum and aluminum doped silicon.

Over a power range of the laser from 1 to 2 watts and for gap widths up to about 2.4 micrometers, the resulting lateral link resistance was typically 0.8 ohms with a standard deviation of 0.2 to 0.4 ohms (see FIG. 3). The link resistance in these devices remained constant up to currents in excess of 200 milliamperes. At larger gap widths and/or lower laser power, the link resistance became larger and more variable. In particular, very large increases in resistance occurred at a gap width of 3.4 micrometers using the laser system described above. This may be due to the fact that the gap width at 3.4 micrometers, at which the link resistance begins to increase and become erratic, corresponds roughly to the diameter of the inner wall of the crater formed as a result of laser sheeting. Furthermore, it is roughly the diameter of the laser beam as measured by its 1/e power points.

It has also been found that when the laser beam described above is displaced from the center of the gap, in a direction parallel to a metal line, mispositioning by 2 micrometers resulted in no degradation in linking for gap widths up to 2.4 micrometers. Mispositioning by as much as 3.1 micrometers caused no degradation in link resistance of gap widths up to 2 micrometers but the link resistances of devices with gap widths of 2.4 micrometers increased and became more variable. It is possible that increasing the beam diameter will increase the range of gap widths and beam misalignment over which good linking occurs. However, gap width and alignment requirements which were shown to provide the good linking noted above, should prove useful either with current VSLI and laser processing system tolerances.

The chart of FIG. 3 provides a summary of the mean and standard deviation of link resistance, in ohms, for various levels of laser power and gap width. As noted, over a very large range, the link resistance typically has a mean of about 0.8 ohms.

The resistance of links which are not bridged is typically greater than $10^9$ ohms at 30 volts or less. The breakdown of voltage, at a gap width of 2 microns, has been measured to be 76 volts and is found to scale linearly with gap width resulting in a gap breakdown field of about $4 \times 10^5$ volts per centimeter. After a postmetallization sintering in a forming gas for three hours at 450° C., the leakage of the unformed links decreased slightly while the breakdown voltage was unchanged.

It is important to note that devices without the oxide barrier layer 34 became shorted after only an hour at 450° C. due to the aluminum silicon interdiffusion. Thus, the thin CVD oxide prevents aluminum silicon interdiffusion and consequent short circuiting of unformed links during the postmetallization sintering process which is common for these devices. On the other hand, if a low temperature sintering process were employed, the diffusion barrier 34 would not be necessary and the silicon layer could abut the conductors. Also, while good linking was consistently obtained at gap widths up to 3.4 micrometers, typical link resistances were larger, for example on the order of 5 ohms, were more variable, but were never larger than about 40 ohms.

While polysilicon is preferred for layer 36, amorphous silicon can also be employed. However, the use of amorphous silicon as a lateral link insulator layer 36 is found to provide both larger and more erratic link resistances. On the other hand, an amorphous silicon layer (46 in FIG. 4) is deposited at a low temperature and hence can be placed either on top of (FIG. 4), or below, the conductors. As before, the need for the diffusion barrier layer 34 depends upon the processing temperature during sintering.

Additions, subtractions, deletions, and other modifications of the preferred described embodiment will be obvious to those skilled in the art and are within the scope of the following claims.

What is claimed is:

1. A method for forming a conductive link in a semiconductor device comprising the steps of
    forming at least a first and a second single layer conductor, said first and second conductors being insulated from each other and having a planar gap therebetween and
    directing a low power laser source at a surface area of said device, including said gap, for forming a conductive bridge across said gap and connecting said first and second conductors.

2. The method of claim 1 further comprising the initial steps of
    forming an electrically insulating layer on a substrate surface of said device, and
    forming an electrically insulating semiconductor layer in an overlying relationship to said electrically insulating layer, said conductors having an overlying relationship to said semiconductor layer.

3. The method of claim 2 wherein said semiconductor layer is a polysilicon layer.

4. The method of claim 3 further comprising the step of
    forming a diffusion prevention layer between said polysilicon layer and said conductors.

5. The method of claim 4 further comprising the step of
    post-metallization sintering said semiconductor device.

6. The method of claim 1 further comprising
    forming an amorphous silicon semiconductor layer in a juxtaposed relationship with said conductors before directing a low-power laser source at a surface area of said device.

7. The method of claim 6 wherein said amorphous silicon layer is in an overlying relationship atop said conductors.

8. The method of claim 7 wherein said conductors are in an overlying relationship atop said amorphous silicon layer.

9. The method of claim 2 or wherein said forming step forms said semiconductor layer in abutting contact with said conductors.

* * * * *